US008536865B2

(12) United States Patent
Roeck et al.

(10) Patent No.: US 8,536,865 B2
(45) Date of Patent: Sep. 17, 2013

(54) IRON-FREE VARIABLE TORQUE MOTOR COMPATIBLE WITH MAGNETIC RESONANCE IMAGING IN INTEGRATED SPECT AND MR IMAGING

(75) Inventors: Werner N. Roeck, Irvine, CA (US); Orhan Nalcioglu, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 690 days.

(21) Appl. No.: 12/763,839

(22) Filed: Apr. 20, 2010

(65) Prior Publication Data

US 2010/0264918 A1 Oct. 21, 2010

Related U.S. Application Data

(60) Provisional application No. 61/171,238, filed on Apr. 21, 2009.

(51) Int. Cl.
*G01V 3/00* (2006.01)
(52) U.S. Cl.
USPC .......................................... 324/307; 324/300

(58) Field of Classification Search
USPC .......................... 324/300–322; 600/407–445
See application file for complete search history.

(56) References Cited

U.S. PATENT DOCUMENTS

| 5,265,611 | A  | * | 11/1993 | Hoenig et al. | 600/409 |
| 5,841,278 | A  | * | 11/1998 | Green et al. | 324/318 |
| 6,204,665 | B1 | * | 3/2001 | Triebe et al. | 324/318 |
| 6,323,647 | B1 | * | 11/2001 | Anderson et al. | 324/313 |
| 6,486,666 | B1 | * | 11/2002 | Grossmann et al. | 324/300 |
| 6,670,811 | B2 | * | 12/2003 | Wind et al. | 324/307 |
| 7,176,386 | B1 | * | 2/2007 | Aidam et al. | 174/391 |
| 2004/0102692 | A1 | * | 5/2004 | Schenck et al. | 600/410 |

* cited by examiner

*Primary Examiner* — Brij Shrivastav
(74) *Attorney, Agent, or Firm* — Marcus C. Dawes; Daniel L. Dawes

(57) ABSTRACT

An apparatus and method for performing dual modality SPECT/MRI imaging on an object in combination with a whole-body MRI system includes a collimated nuclear radiation detector for receiving radiation from the object, and a radiofrequency MRI coil enveloping the object and interfaced with the collimated nuclear radiation detector. The MRI coil and collimated detector are arranged and configured for disposition within the whole-body MRI system.

7 Claims, 6 Drawing Sheets

Fig. 3a
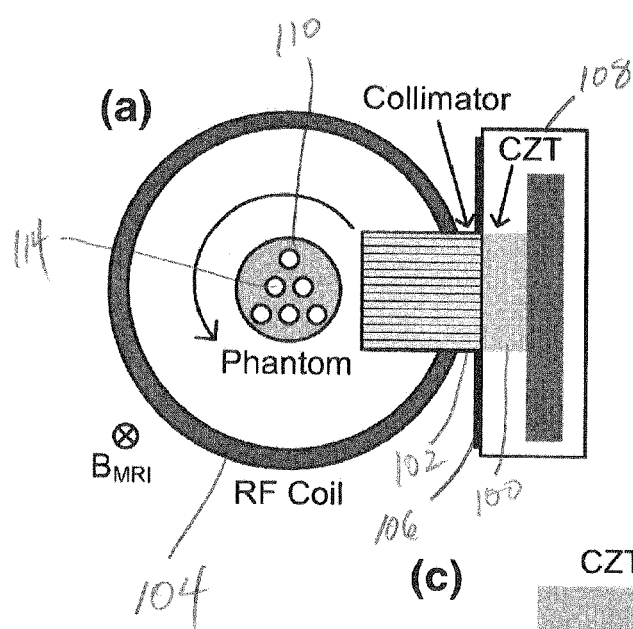
Fig. 3b
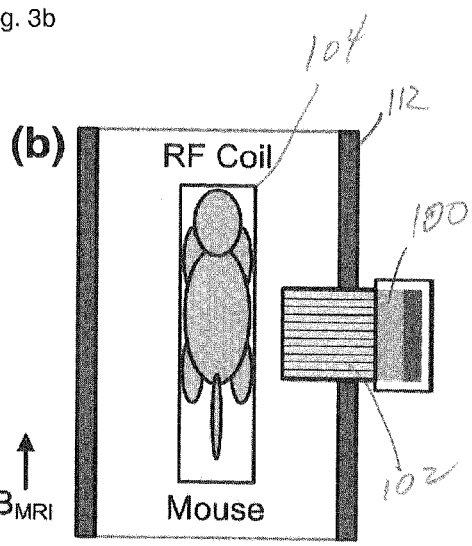
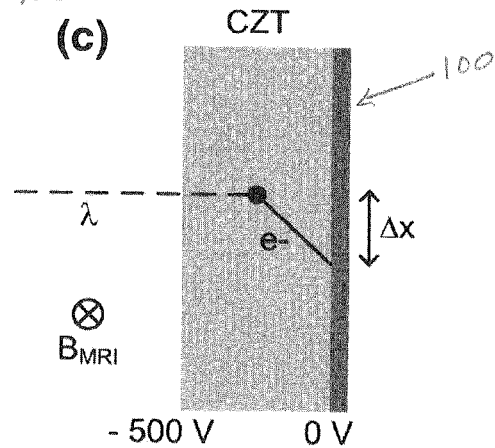
Fig. 3c

IRON-FREE VARIABLE TORQUE MOTOR COMPATIBLE WITH MAGNETIC RESONANCE IMAGING IN INTEGRATED SPECT AND MR IMAGING

RELATED APPLICATIONS

The present application is related to U.S. Provisional Patent Application, Ser. No. 61/171,238 filed on Apr. 21, 2009, which is incorporated herein by reference and to which priority is claimed pursuant to 35 USC 119.

BACKGROUND OF THE INVENTION

1. Field of the Invention

The invention relates to the field of magnetic resonance imaging methodologies in which dual imaging modes are employed and to electric motors used in the MRI environment.

2. Description of the Prior Art

High magnetic fields used in magnetic resonance imaging (MRI) do not allow the employment of conventional motors due to various incompatibility issues. Magnetic resonance imaging (MRI) is a well-accepted tomographic technique that can be used to acquire high-resolution anatomical three dimensional images of the human body. Although MRI could also provide functional or metabolic information its sensitivity is low compared to other medical imaging techniques such as positron emission tomography (PET) or single photon emission tomography (SPECT). If one wishes to combine the high resolution advantages of MRI with the high sensitivity of nuclear imaging techniques such as SPECT or PET one normally would have to perform image acquisitions separately and then co-register the resultant images either by software techniques or using fiducial markers. Although such co-registration approaches work on rigid organs such as the head it is impossible to perform them accurately on other less rigid body parts such as the abdomen.

Even if the spatial co-registration could be achieved, temporal coregistration cannot be done in the time domain for combined dynamic studies using both imaging techniques simultaneously. This has forced researchers to explore the development of multimodality devices that can integrate a high sensitivity metabolic imaging device such as PET or SPECT into a magnet for fully co-registered PET or SPECT-MR imaging. Some of the challenges one faces in such endeavors include magnetic field compatibility of detectors, data acquisition electronics, and collimators (if there are any). Another difficulty that arises when the detector has to undergo rotational scanning for collecting different angular views is the availability of a motor that can operate close to the magnet bore without affecting the MR image quality or endangering the patient.

A magnetic resonance imaging (MR) compatible motor has been described in "A New Type of Motor: Pneumatic Step Motor" was published by Stoianovici et al in the IEEE/ASME Trans on Mechanotronics v.12 pp 98-106. The motor produces a rotary motion by discrete displacement by sequentially pressurizing the three ports of the motor. Yamamoto developed and evaluated an MR compatible electrostatic motor that is based on thin plastic films and flexible printed circuit technology. They have shown that the linear motor did not affect MR images when operated at distances over 60 cm from the magnet. Although the motor is MR compatible the amount of torque that can be generated limits its use to low torque applications that are more along the line of medical robotics.

A second example is described in Yamamoto et al. "Evaluation of MR-compatibility of Electrostatic Linear Motor" published in Proc. 2005 IEEE Int. Conf. on Robotics & Automation, Barcelona, Spain. This is a high-power electrostatic motor made of paramagnetic materials. Its operation is based on the induced Lorentz forces moving one segment of the motor against the other in a linear movement. Stoianovici's pneumatic step motor that is also compatible with magnetic fields that are used in MR systems. This step motor provides rotational motion and has been shown to deliver torques up to 0.6 N-m. The specific aim of both of these developments is to offer a motor that could be used in MR-guided robotic surgery.

The problem of providing a practical motor for use in an MRI environment is not completely solved for applications that require a large torque to rotate heavy components such as nuclear detectors with collimators. None of the solutions described above satisfactorily resolve this need.

Through the use of highly specific radiolabeled molecular probes, nuclear imaging techniques such as single-photon emission computed tomography (SPECT) can provide insight into a wide range of biological processes with demonstrated applications in neurology, cardiology, oncology and, more recently, stem cell research. However, the relatively poor spatial resolution of radionuclide techniques can make unambiguous localization of the probes extremely difficult, especially when the images lack significant anatomical detail for reference. Limited spatial resolution can also hamper quantification of the probe concentration, especially when localized in small volumes. A unique advantage of SPECT over position emission tomography (PET) is that simultaneous multiple isotope imaging is also possible if the detector has high energy resolution. This opens up the possibility of labeling different molecules with different radioisotopes and performing multidimensional molecular imaging to investigate various biological processes simultaneously.

In contrast to SPECT, magnetic resonance imaging (MRI) can provide exceptionally high spatial resolution anatomical information as well as localized chemical and physical information (i.e., metabolite concentrations, water diffusion characteristics). SPECT and MRI each have their respective advantages and limitations. Integrating these two modalities in a synergistic manner would allow researchers to exploit the strengths of both techniques. For example, MRI data can be utilized to improve the accuracy and spatial resolution of the reconstructed SPECT images. Such improved resolution should reduce partial volume effects, where inaccuracies in quantification of the radiotracer concentrations can occur in smaller structures. This effect becomes significant, for example, in the interpretation of SPECT images of tumors, where a measured decrease in the uptake of a radiotracer following treatment could indicate tumor shrinkage, a change in biological function, or both. Segmentation of the MR images can be used to facilitate attenuation correction of the nuclear projection data, also improving the accuracy of the SPECT reconstruction. Anatomical MR images can provide a reference for the SPECT images, allowing for improved localization. The ability to acquire SPECT and MRI data simultaneously would open up new research opportunities in dynamic imaging using both SPECT radionuclides and MRI contrast agents at the same time with optimum spatial and temporal co-registration. This would provide motivation for the development of appropriate bi-functional imaging probes. Additional advantages of simultaneous SPECT and MRI measurements over separate or sequential acquisitions include the reduction of co-registration errors, decrease in the overall scan time, and the possibility of using the MR images to correct for motion artifacts in the SPECT data. A comprehensive rationale for combining SPECT with MRI was given by Wagenaar et al.

While the integration of SPECT and MRI offers numerous advantages and new opportunities, it also presents many technological challenges. The SPECT detectors must function within an operating MRI scanner. Likewise, the SPECT hardware must not significantly perturb the MR images. Due to these challenges, the development of a combined SPECT and MRI system (henceforth called MRSPECT) is in its infancy, and a very limited amount of research has been reported to date. Breton et al., and Goetz et al., used a strategy similar to PET-CT systems in which a small animal SPECT system was brought in close proximity to a separate MRI system. While they demonstrated excellent results, they utilized a substantially low magnetic field (0.1 T) and performed sequential SPECT and MR imaging. Meng et al., presented the design of an MR-compatible SPECT system for mouse brain imaging based on cadmium-zinc-telluride (CZT) nuclear radiation detectors. While they investigated the effects of the SPECT and MRI components on each other, they confined their disclosure to the use of a 57Co point source for SPECT imaging and were not able to acquire simultaneous SPECT and MRI experimental data. We recently reported on the design and operation of an MRSPECT system also based on CZT detector technology. In that disclosure, the effects of the SPECT and MRI components on each other were characterized through various phantom experiments. The results demonstrated the feasibility of co-registered, simultaneous SPECT and MR imaging.

BRIEF SUMMARY OF THE INVENTION

This disclosure discloses a motor that can operate in or near high field magnets used for MRI. The motor is iron free and is designed to be operational with the MRI equipment, and is used in a rotating imaging gantry inside the magnet designed for dual modality imaging. Furthermore, it is also used for image guided robotic interventional procedures inside an MRI system if so desired. The illustrated embodiment includes an apparatus for use in an MRI field to rotate an object relative to the MRI field comprising an MRI compatible electric motor having no included magnetic field within the motor, which motor is disposed at least in a portion of the MRI field employed in place of the omitted field magnetic field within the motor. What is illustrated is a DC motor without an internal magnetic field or a motor field independent of the MRI environment, but it is to be explicitly understood that any type or kind of electric motor which employs the MRI magnetic field as the operative magnetic field utilized within the motor for generation of motive forces, with or without an internal magnetic field, is included within the scope of the invention. Hence, the illustrated embodiment includes an apparatus for use in an MRI field to rotate an object relative to the MRI field which includes an MRI compatible electric motor disposed at least in a portion of the MRI field to employ the MRI field at least in part as a magnetic field within the motor for generation of motive force. In another embodiment the MRI compatible electric motor has no independently included magnetic field within the motor and where the MRI field is employed as the only magnetic field within the motor for generation of motive force.

The prototype motor is developed using magnetic resonance (MR) compatible materials, i.e. free of iron and other types of magnetic or paramagnetic materials and its functionality with MR imaging is evaluated experimentally by measuring the performance of the motor and its effect on the MR image quality. Since in our application, namely single photon emission tomography (SPECT), the motor has to perform precise stepping of the gantry in small angular steps an important parameter is the start-up torque. The experimental results showed that the motor has a start-up torque up to 1.37 N-m and rotates at 196 rpm when a constant voltage difference of 12 V is applied at a magnetic field strength of 1 T. The MR image quality is quantified by measuring the signal-to-noise of images acquired under different conditions. The results presented here indicate that the motor is MR compatible and could be used for rotating an imaging gantry or a surgical device inside the magnet.

Many imaging applications and MR based intervention procedures require the use of a motor that would operate in high magnetic fields. The illustrated embodiment of the invention disclosed here is a robust solution that would address all kinds of different applications that require the use of such a motor.

The illustrated embodiment of the invention is an electrical motor that operates inside an MR scanner gantry without being affected by the high magnetic field and also does not degrade the quality of the MR images. It is comprised of a disc made of MR compatible material that contains a number of identical coils placed radially. When an electric current is passed through each coil the induced magnetic field interacts with the main magnetic field exerting a tangential torque that results in the rotation of the disc. The amount of torque is dependent on the main magnetic field, the number of coils, the applied current and the size of the disc.

The illustrated embodiments are directed to the ability to rotate a heavy imaging gantry including detectors, collimators and associated cabling inside the magnet for dual modality imaging where a metabolic imaging device could be operated inside a magnet. The amount of torque that can be delivered by the motor presented below is higher than those previously reported and is dependent only on the applied voltage and the local magnetic field. The variable torque motor illustrated here is also totally MR compatible, safe, and could be used in various applications including MR-guided robotic surgery. The illustrated embodiment of the invention disclosed exerts large torque with direct rotational motion and does not degrade MR images at distances larger than 30 cm from the magnet's center.

The full scale version of this device could be used to rotate other imaging devices inside the magnet for multi modality imaging using two different imaging modalities, for example in MRI and nuclear imaging. Miniaturized versions of the device could be used in medical robotics for MR guided surgery or biopsy. Medical imaging companies trying to integrate other imaging devices inside the magnet that require rotational movement of the detectors could use this device. Additionally it could also be used by companies offering MR guided interventional devices such as MR guided biopsy, etc.

In summary, the apparatus further includes an MRI compatible electric motor for rotating the object relative to the whole-body MRI system.

The whole-body MRI system has a main static magnetic field produced by a main magnet and further includes in one embodiment an electrical motor for operation within the whole-body MRI system which includes a disc made of MRI compatible material, and a plurality of electromagnetic coils disposed radially on the disc, so that when an electric current is passed through each coil, an induced magnetic field interacts with the main static magnetic field exerting a tangential torque to produce a torque on the disc depending on the main static magnetic field, the number of the coils, the applied electric current and the size of the disc.

The electrical motor exerts a variable torque with direct rotational motion and does not degrade MR images at distances larger than 30 cm from the center of the main magnet of the whole-body system.

The applied current to each coil is synchronized with a rotational spatial position of the corresponding coil of approximately 90° relative to the main static magnetic field.

A method includes the step of rotating the object relative to the whole-body MRI system using an MRI compatible electric motor.

The method may further include the step of disposing an MRI compatible rotatable disc having a plurality of coils disposed on a rotatable disc into a fringe magnetic field of the whole-body MRI system and selectively applying an electric current through each coil of a plurality of coils disposed on a rotatable disc to generate a tangential torque on the disc depending on the main static magnetic field, the number of the coils, the applied electric current and the size of the disc.

The step of applying an electric current through each coil of a plurality of coils disposed on a rotatable disc to generate a tangential torque on the disc includes the step of producing a variable torque with direct rotational motion without degradation of MR images at distances larger than 30 cm from the center of the main magnet of the whole-body system.

The step of applying an electric current through each coil of a plurality of coils includes the step of synchronizing the application of the applied current to each coil with a rotational spatial position of the corresponding coil of approximately 90° relative to the main static magnetic field.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

FIG. 3a is a diagrammatic end view with a phantom and FIG. 3b is a diagrammatic top view with a mouse of the integrated nuclear radiation detector and RF coil within the MRI magnet bore. FIG. 3c is a schematic of the Lorentz shift.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE ILLUSTRATED EMBODIMENTS

Figure 1:
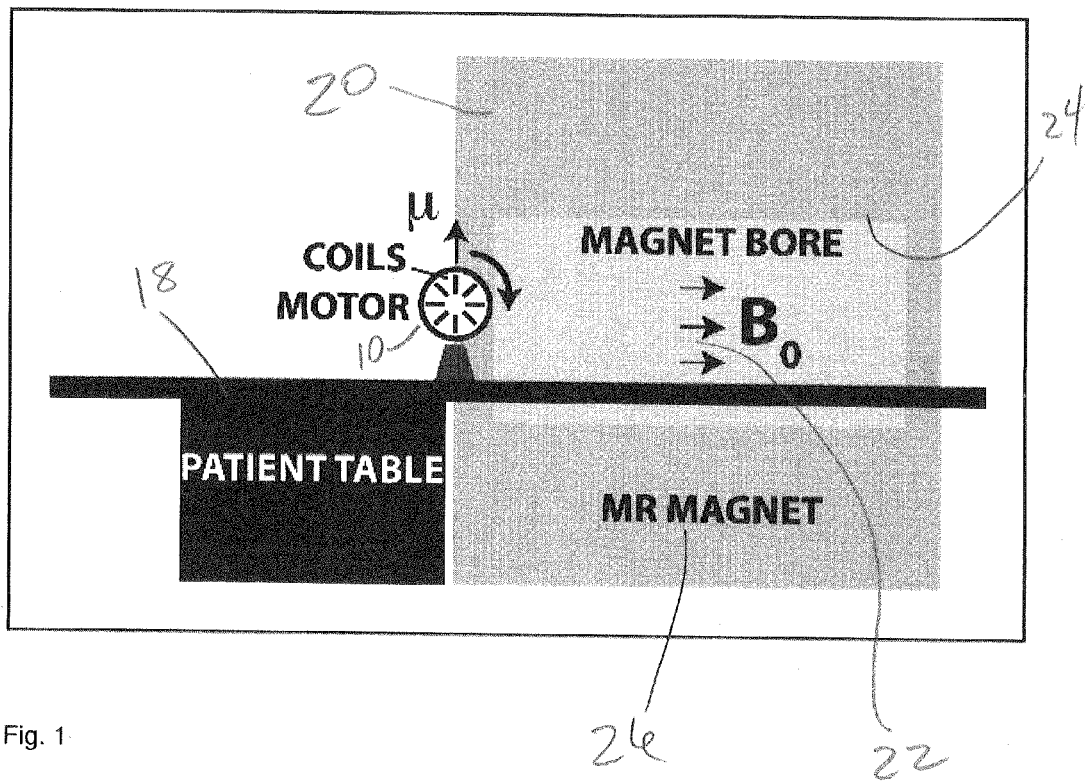
FIG. 1 is a diagram of an experimental set-up showing the MR compatible motor.
Figure 2:
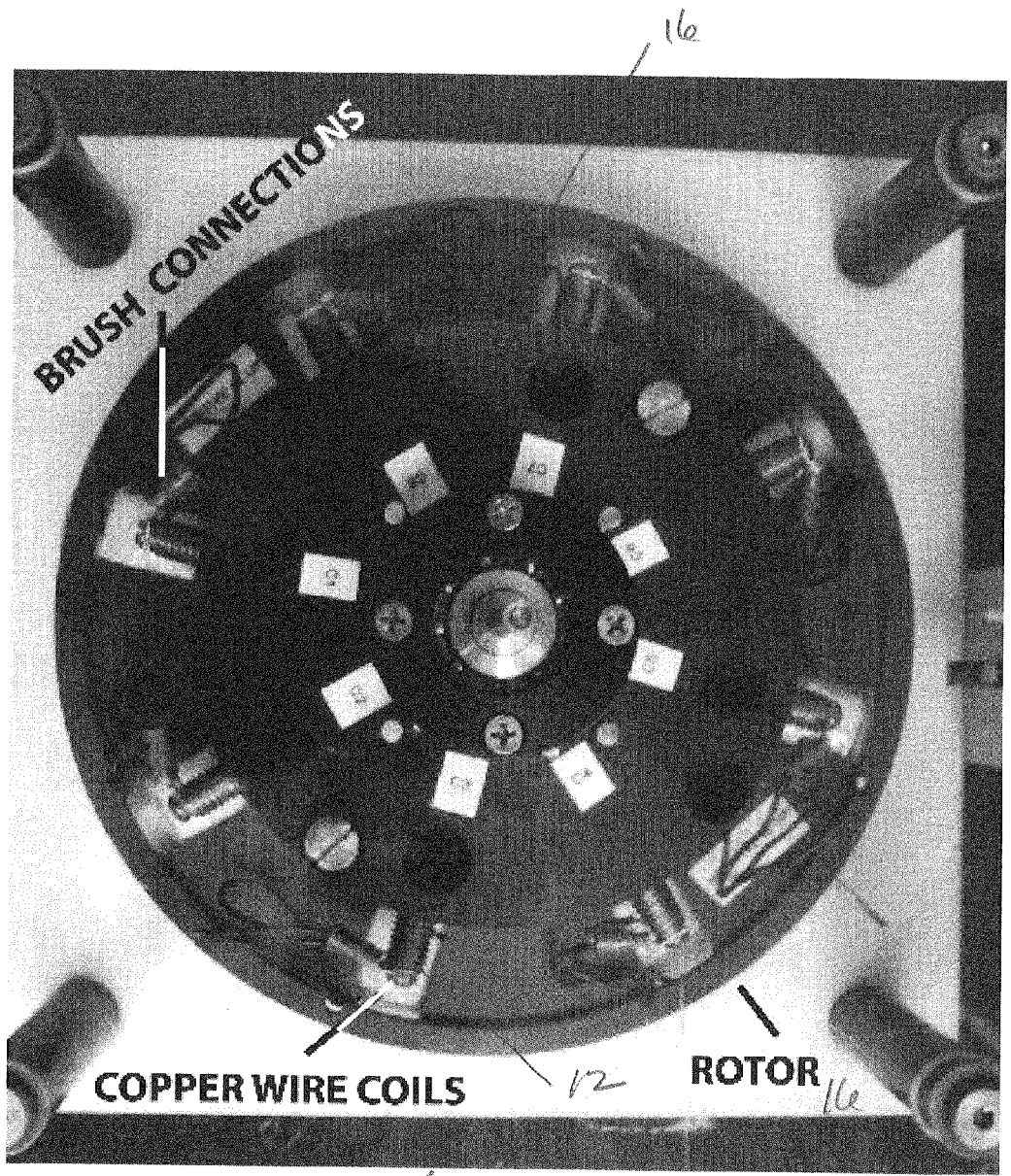
FIG. 2 is cross sectional view of the rotor.

An illustration of a prototype motor 10 and the experimental set-up is shown diagrammatically in FIG. 1. The motor assembly 10 is constructed with MR compatible plastic material and screws and bolts made out of brass. The motor assembly 10 shown in the photograph of FIG. 2 includes eight MR compatible copper coils 12 wound onto a plastic bobbin (not shown) placed radially within the rotor body 16 and separated by 45 degrees from each other as shown in FIG. 2. The outer diameter of the main rotor body 16 is 20.3 cm. Directional rotary motion is achieved by passing electric current through opposing coils 12 by means of a pair of dedicated brushes (not shown) under computer control and hence creating a torque due to the interaction of the magnetic field induced in coils 12 carrying current with the magnetic field of the MR system as shown in FIG. 1.

As well known from basic electromagnetics the torque is linearly related to the local magnetic field of the MR system and the controlled current injected into the diametrically opposing coils 12. The current injection into the individual coil 12 is synchronized with its rotational spatial position of approximately 90° in reference to the $B_0$ magnet field 22 and is timed by means of a simple commutator well known in the art. In fact, this is simply a modification of a permanent magnet based DC motor where in this case the magnetic field is provided by the stray field of the MRI magnet 26. Therefore, the correct placement of the motor 10 within the $B_0$ field 22 of the magnet 26 is a material performance parameter or constraint. The torque generated by the motor 10 can then be transmitted to a gantry for nuclear imaging or to a robot that can be used in image guided interventional procedures via an MR compatible gear system with an appropriate reduction ratio.

The motor 10 is placed near a 4T whole-body MRI system 20 with the plane of rotation aligned with the $B_0$ magnetic field as shown in the plane of FIG. 1. The magnetic field on the patient couch or table 18, where the motor 10 is located, is measured using a Gauss-meter (Magnetic Instruments, Inc.—

Model 907) to determine the magnetic field at different positions inside the magnet 26. The experiments were undertaken to characterize the performance of the described motor 10. This included varying the applied voltage and measuring the start-up torque and rotational velocity. Additionally we also measured the effect of motor 10 on the MR images while it is stationary and rotating. The motor 10 is positioned centrally 135 cm from the magnet's center (at the magnet face) where the field strength is 1 T. The position of the motor 10 did not change during all the experiments. The rotational velocity is measured at 1 T as a function of applied voltage using an optocoupler interfaced with a personal computer via a National Instruments data acquisition card (NI USB-6008).

We then evaluated the MRI compatibility of the device by acquiring MR images with and without the motor 10. The MR images of a phantom like those shown in FIGS. 4a-4f placed inside an RF coil 104 as shown and discussed below in connection with FIG. 3a below were acquired while the motor 10 operated at different rotational speeds. DC voltages covering a range of 6-14 V were applied to each opposing pairs of solenoid coils 12 via the commutator. The rotational speed is measured using the optocoupler-personal computer setup described above.

In order to evaluate the performance of the motor 10 described above we acquired MR images of a cylindrical phantom filled with distilled water and 10 mM of $CuSO_4$. Axial MR images were collected when the motor 10 is stationary, i.e. no voltage applied, and when rotating under various constant applied voltages varying from 8 to 12 volts. The signal-to-noise ratio (SNR) is measured in each image and compared to the case of stationary motor 10 to evaluate its effect on the MR images.

The first parameter measured is the rotational speed as a function of applied voltage at a constant magnetic field strength of 1 T. The voltage range used in this set of measurements covered 6-14 volts. It should be pointed out that the current in the coils is directly proportional to the applied voltage due to constant resistance of the coils. The rotational speed of the motor 10 is measured using the optocoupler-personal computer setup described earlier. It is found that the rotational speed is linear with a correlation coefficient of $R_2=0.99$ within the measurement range as one would expect. The relationship between the start-up torque and applied voltage is also measured and found to be linear as expected with a correlation coefficient of $R_2=0.99$. The maximum torque, 1.37 nt-m is obtained at 12 V applied voltage. We point out that such values of torque are more than adequate to rotate a gantry that has multiple collimated detectors weighing as much as 50 kg by application of a reduction gearbox.

In order to evaluate the MR compatibility of the motor 10 we kept it at the constant position of 1 T as previously stated and acquired MR images of a phantom. We then applied 8, 10, and 12 volts and acquired axial MR images while the motor 10 is moving at different rotational speeds. The signal-to-noise ratio (SNR) is measured and seen to decrease by about a factor of two with unshielded motor 10 running. In order to reduce the noise arising from the moving motor 10 we RF shielded the motor 10 and this resulted in the reduction of most of the extra noise.

The results presented here show that the motor 10 proposed here is capable of delivering adequate torque to move an imaging gantry weighing as much as 50 kg when placed at a magnetic field strength of 1 T. The performance of the motor 10 is linear as a function of applied voltage due to the basic principle that it is based on. We have not observed any image nonuniformity problems due to material incompatibility with the magnetic field. However, when the motor 10 starts rotating a certain amount of electrical noise is injected into the MR images resulting in a serious degradation of the image SNR up to ~50%. The residual signal in the MR images, defined as the percentage difference between the stationary motor 10 case versus when the motor 10 is activated, is improved by 65% by introducing an RF shield around the motor 10. We were able to reduce this degradation in the SNR to 2% by simply RF shielding the motor 10 with a Faraday cage.

Due to the availability of wire coils wound on plastic bobbins we have chosen this straightforward design to establish the basic principle of operation for our prototype motor 10. More advanced configurations are currently being investigated with the additional goal of reducing the overall size of the motor 10-gear box assembly. In conclusion, the motor 10 described here is a practical solution to the needs of MR based multi-modality imaging by offering high level start-up torque to move the gantry of the second imaging modality from one angular position to another for tomographic data acquisition.

Design of the MRSPECT System

For SPECT imaging, we utilized a CZT-based nuclear radiation detector (Gamma Medica-Ideas) that includes a 25.4×25.4×5 mm CZT crystal 100 shown diagrammatically in FIG. 3c coupled to 256 (16×16) detector elements (not shown). The detector elements are integrated with low-power application-specific integrated circuit (ASIC) readout electronics which are connected to a carrier board that was mounted inside a plastic box. This housing and cables connecting the carrier board to the interface electronics were wrapped with a fine copper mesh for radiofrequency (RF) shielding. Remaining components such as the power supplies, interface electronics, and computer were located in a control room outside an RF-shielded MRI room.

The 5 mm thickness of the CZT crystal 100 makes the detector suitable for use with isotopes which emit low-energy gamma rays (e.g., absorption efficiency ~90% at 140 keV). Wagenaar et al., previously reported that this detector yields a high quality pulse height spectrum (PHS) of a 57Co source (121 keV) in up to a 7 T magnetic field, with an energy resolution (~5%) considerably better than that of scintillation-based detectors in the absence of a magnetic field. The high energy resolution of the CZT detector allows for much narrower windowing around the photopeak without losing detection sensitivity, resulting in an improved signal-to-noise ratio (SNR). Such energy discrimination also makes it possible to perform multi-isotope studies when using combinations of low energy gamma ray emitters, such as: 99mTc and 123I; 99mTc and 201Tl; and 99mTc and 111In.

A 2.54×2.54×2.54 cm lead parallel-hole collimator 102 in FIG. 3a comprised of 1.2 $mm^2$ squares holes separated by 0.4 mm septa was positioned on the CZT detector 100. While pinhole collimators are necessary for micro-SPECT applications, we selected a parallel-hole collimator 102 to simplify the setup and maximize sensitivity in this preliminary disclosure. The open end of the collimator 102 was inserted between the rungs of a custom-built RF birdcage coil 104, which was utilized for MR imaging. Additional lead shielding 106 was placed on the front of the detector housing 108 to minimize the number of stray gamma rays striking the detector 100.

The overall design avoids any attenuation of the detected gamma rays by the RF coil materials and allows for adjustment of the distance from the collimator 102 to the object 110 being imaged. In this disclosure, this distance was set to 10 mm, which represents a reasonable compromise between SPECT and MR image quality. Shorter distances would slightly improve the SPECT resolution, but substantially increase the adverse affects of the lead components on the MR images. To simply the setup in this preliminary disclosure, the position of the nuclear radiation detector 100 and RF coil 104 remained fixed while the object 110 being imaged was manually rotated in order to acquire data at different views for tomographic imaging. However, it is expressly understood that the motor 10 disclosed above is employed in the illustrated embodiment to rotate object 110.

The nuclear radiation detector 100 and RF coil 104 were placed within a 4 T whole-body magnet (Magnex Scientific) with a clear bore of 940 mm. The large bore size accommodates a variety of instruments, such as in this disclosure, thus making it possible to pursue multimodality imaging research. The MRI system uses a 12 kW 4T12K RF amplifier (CPC) and a whole body gradient coil with a 13-channel shim set (Tesla Engineering), along with a QDCM 950/200/4400 gradient amplifier (MTS) capable of generating fields up to 30 mT/m with a slew rate of 115 T/m/s at 940V/440A. The hardware is interfaced to a MR6000 console (MR Solutions) for pulse sequence generation and MR data acquisition.

Nuclear Imaging Corrections

When a semiconductor-based nuclear radiation detector 100 is placed within a magnetic field, electron-hole pairs created from the interaction of absorbed gamma rays are subject to the Lorentz force. As a result, when the CZT-based detector 100 is placed in any orientation other than parallel or anti-parallel to the main static magnetic field 22 of the MRI system (+/− z-direction), electrons traveling towards the anode will experience a shift in their detected position as illustrated in FIG. 1c. The magnitude of this shift depends on the magnetic field strength, detector orientation, absorption and diffusion properties of the semiconductor, bias voltage across the semiconductor, and energy of the incident gamma rays. For our particular MRSPECT system configuration, we previously measured a mean 'Lorenz shift' of 1.4 mm. This effect should be taken into account prior to SPECT reconstruction by shifting the nuclear projection data to their proper locations.

In addition, the raw images of any nuclear imaging system must be normalized by a flood field image to account for inherent spatial variations in the detector sensitivity. This is particularly important for semiconductor-based detectors, where inherent imperfections in the crystal result in a non-uniform sensitivity across the detector elements. To perform this uniformity correction, a flood field image is first acquired by exposing the detector 100 to spatially uniform activity. Subsequent nuclear projection images are then normalized by this flood field image pixel by pixel to obtain the uniformity-corrected images. To investigate the effects of the Lorentz shift on this uniformity correction, we acquired 99mTc flood field images using a 10% energy window around the 140 keV photopeak both outside (at 0 T) and inside (at 4 T) the MRI magnet bore 24 with the detector oriented as in FIG. 3b.

Phantom Experiments

To investigate the integration of SPECT and MRI using our MRSPECT system, we first imaged a phantom 110 consisting of a hollow acrylic cylinder with an inner diameter of 19 mm, shell thickness of 1.6 mm, and length of 70 mm. Smaller acrylic rods 114 each 3 mm in diameter were positioned axially within this cylinder. The interior region was filled with 5 mCi activity of 99mTc and a 10 mM CuSO4 solution. The entire phantom was positioned inside the RF coil with its axis parallel to the z-direction as shown in FIG. 3a.

The presence of lead components (collimator and shielding) was previously found to deteriorate the homogeneity of the main static magnetic field 22. Thus prior to SPECT/MRI data acquisition, the phantom was shimmed using up to 3rd order corrective shim coils powered by a MXA-13-R shim power supply (Resonance Research). After interaction of an incoming gamma ray with the CZT crystal 100, the resulting electron is deflected by a distance Δx due to the Lorentz force.

The optimum shim channel values were calculated using a constrained least-squares-fit algorithm. After shimming, simultaneous SPECT/MRI data were acquired for 30 equally spaced views around 360 degrees about the z-axis. For each view, data was only acquired after the phantom was positioned and not during rotation from the previous view in order to avoid any motion artifacts.

For MR imaging, an axial slice through the center of the phantom was acquired using a two-dimensional spin-echo (SE) pulse sequence with the following parameters: repetition time (TR)=500 ms, echo time (TE)=20 ms, field-of-view (FOV)=40 $mm^2$, matrix=128×128, slice thickness=5 mm, receiver bandwidth=33.3 kHz, and number of excitations (NEX)=2. Nuclear projection data were acquired using a 10% energy window around the 140 keV photopeak. For each view, the nuclear projection data acquisition time coincided with the length of the MRI scan (~2 minutes).

Image Reconstruction

Prior to tomographic reconstruction, the nuclear projection data underwent uniformity correction. For comparison, one copy of the projection data was normalized using the flood field image acquired outside the magnet 26 while a second copy was normalized using the flood field image acquired inside the magnet 26. After uniformity correction, compensation for the Lorentz shift was performed by shifting the projection image for each view by 1.4 mm in the appropriate direction. For comparison, a copy of the projection data without any shift correction was retained.

Attenuation correction (AC) of the nuclear projection data was also investigated. Determination of an accurate object-specific attenuation map is required to perform AC. Strategies for obtaining this attenuation map include 1) importing and registering the map derived from another modality, 2) acquiring transmission data for estimating the map using an external source, and 3) estimating the map solely from the emission data. Our integrated SPECT and MR imaging allows us to utilize the first method. The contribution of each (active) voxel to a given projection image was attenuated by the product over N of $\exp(-\mu_N dN)$, where $\mu_N$ is the linear attenuation coefficient of the N-th phantom component (water or acrylic) and dN is the distance across the N-th component region from the voxel to the detector. For each view, the co-registered MR image was used to segment the different component regions, define the known regions of activity (water region), and measure the dN. An AC factor was then calculated and applied to the projection data. For comparison, a copy of the projection data without AC was also retained.

For each of the various nuclear projection image sets, data corresponding to the location of the MRI slice were selected for SPECT reconstruction. For each set, half a million total counts were selected and corrected for decay across the data acquisition period. Filtered back-projection (FBP) with the Shepp-Logan filter (cut-off frequency=0.315 cycle/mm) was performed on these data, and the resulting reconstructed SPECT images were interpolated to the same FOV and matrix as the corresponding MR image for direct comparison.

After SPECT reconstruction, we next investigated the utilization of the high-spatial resolution MR image for improvement of the spatial resolution and accuracy of the SPECT image. Following the technique of Chou et al., the Wiener filter was applied to the SPECT image with the point spread function of the MRSPECT system modeled by a Gaussian normal distribution function characterized by the (unknown) full width at half maximum (FWHM) w. The optimum value of w was determined by maximizing the mutual information between the resulting filtered SPECT image and the co-registered MR image. For comparison, a copy of the SPECT image without any filtering was also retained.

In Vivo Animal Imaging

After the phantom experiment, a nude mouse was utilized to test small animal imaging with our MRSPECT system. The animal was first anesthetized and fixed within an acrylic cylinder. A small tube with an inner diameter of 2 mm was filled to a height of 4 mm with 1 mCi of 99mTc and inserted rectally into the animal. The cylinder containing the animal was then placed within the MRSPECT system for simultaneous dual-imaging as diagrammed in FIG. 3b. Shimming was first performed using the previously described procedure, then simultaneous SPECT/MRI data were acquired for 30 views about 360 degrees using the same imaging parameters as with the phantom experiment. Inspection of the MR images across the different views verified that the position of the animal within the cylinder remained fixed throughout the experiment. Based on the results of the phantom experiment, the nuclear projection data was normalized using the flood field image acquired inside the magnet 26 and corrected for the Lorentz shift. SPECT reconstruction was then performed using the previously outlined methodology.

Phantom Experiments

Figures 4A, 4B, 4C, 4D, 4E, 4F:
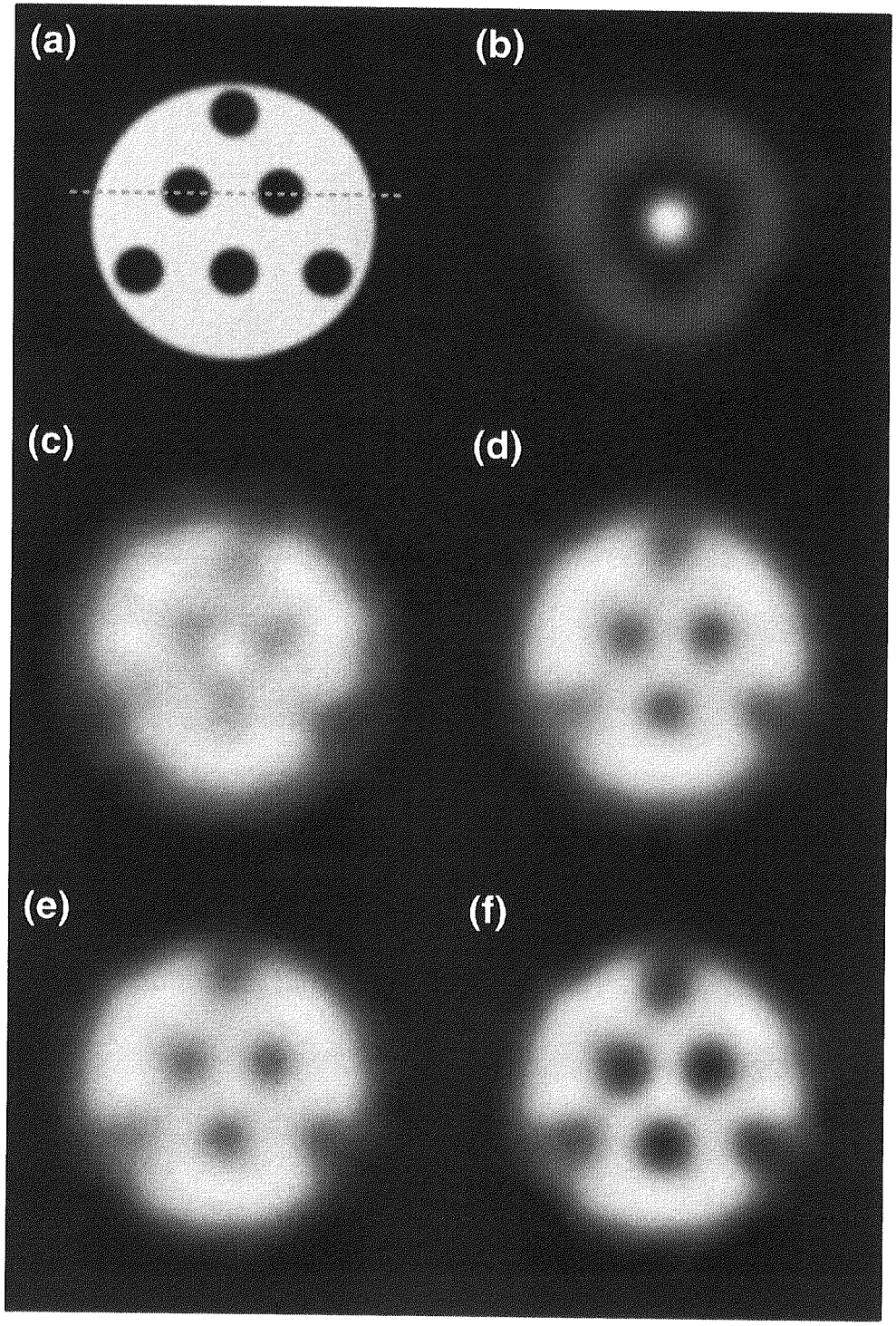
FIG. 4a is an MR image of the phantom. The gray dashed line was used to generate the profiles in FIG. 5.
FIG. 4b is a SPECT image reconstructed using projection data normalized by the flood field image acquired outside the magnet.
FIG. 4c is a SPECT image reconstructed using the projection data normalized by the flood field image acquired inside the magnet, but not corrected for the Lorentz shift.
FIG. 4d is a SPECT image reconstructed using the projection data normalized by the flood field image acquired inside the magnet and corrected for the Lorentz shift.
FIG. 4e is a SPECT image reconstructed using the projection data properly normalized and corrected for the Lorentz shift, as well as corrected for attenuation using an MRI-based map.
FIG. 4f is a SPECT image reconstructed using the fully corrected projection data and restored using a Wiener filter optimized though the maximization of mutual information with the co-registered MR image.

The axial MR magnitude image of the phantom 110 is shown in FIG. 4a. The corresponding SPECT images reconstructed using the various nuclear projection data sets are shown in FIGS. 4b-4e. The SPECT image resulting from application of the optimized Wiener filter is shown in FIG. 4f. Profiles of the SPECT images of FIGS. 4d-4f across the gray dashed line in FIG. 4a are plotted in the graph of FIG. 5.

The SPECT image reconstructed using the projection data normalized by the flood field image acquired outside the magnet 26 is highly distorted in FIG. 4b. The SPECT image reconstructed using projection data normalized by the flood field image acquired inside the magnet 26, but not corrected for Lorentz shift is more accurate, but still distorted in FIG. 4c. In contrast, the SPECT image reconstructed using projection data normalized by the flood field image acquired inside the magnet 26 and also corrected for Lorentz shift is the most accurate of the three images as shown in FIG. 4d. These results demonstrate that uniformity correction of data acquired within an MRI system must be performed using a flood field image also acquired within the MRI at the appropriate location. Furthermore, data must be properly corrected for the Lorentz shift prior to tomographic reconstruction.

AC of the projection data does not appear to drastically improve the SPECT reconstruction seen in FIG. 4e. However, close inspection of the profiles in FIG. 5 reveals that AC slightly sharpens the phantom boundary and reduces signal loss in the central region of the reconstructed SPECT image. While these effects are subtle, their significance increases when imaging larger objects (e.g. humans) that generate greater attenuation. Nevertheless, even for these small-animal scales, gamma ray attenuation produces a measurable effect that degrades the accuracy of SPECT imaging. These results demonstrate the feasibility of utilizing simultaneously-acquired co-registered MR images for AC in SPECT.

For this disclosure, we utilized a simple AC method appropriate for our (two-component) phantom where the 99mTc radioisotope was known to be uniformly distributed within the water region. For the more general case of an unknown radioisotope distribution, we could still perform AC by first generating the SPECT reconstruction without AC, then using the resulting image (of the reconstructed radioisotope distribution) to perform the previously detailed AC. The corrected projection data could then be used to generate a more accurate SPECT reconstruction, and this process could then be iterated to further improve the results. Alternatively, other reported AC techniques could be applied to reconstruct the SPECT images of more complex objects.

Figure 5:
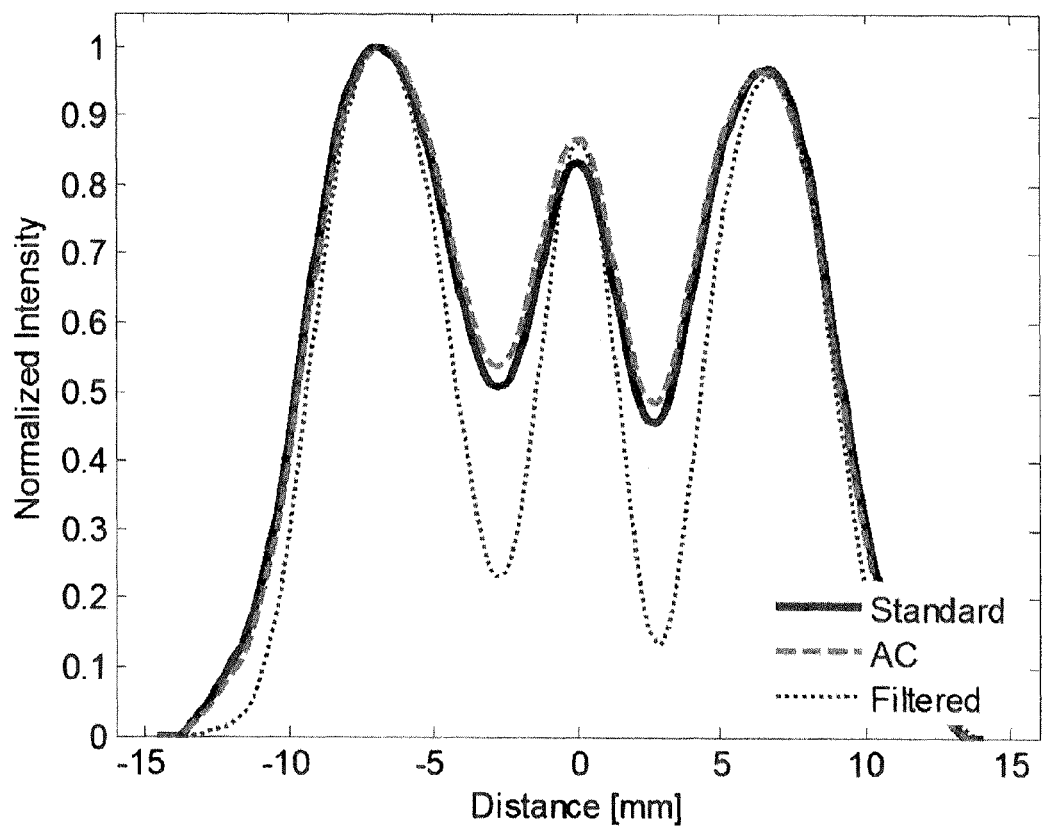
FIG. 5 is a graph of normalized intensity verses distance showing the profiles of the SPECT images taken across the gray dashed line in FIG. 4a. "Standard" corresponds to the SPECT image reconstructed using the projection data normalized by the flood field image acquired inside the magnet and corrected for the Lorentz shift. "AC" corresponds to the SPECT image reconstructed using the projection data properly normalized and corrected for the Lorentz shift, as well as corrected for attenuation. "Filtered" corresponds to the SPECT image reconstructed using the fully corrected projection data and restored using the optimized Wiener filter.

Inspection of FIGS. 4f and 5 reveals that the accuracy of a lower spatial resolution SPECT image can be improved through the use of a corresponding higher spatial resolution MR image. In this specific case, the maximization of mutual information between the SPECT and MR images successfully optimized the Wiener filter utilized for image restoration. This represents a 'post-processing' algorithm, where the MRI data was utilized to improve the SPECT image after tomographic reconstruction of the projection data. Algorithms that integrate MRI information directly into the SPECT image reconstruction may offer improved performance and should be investigated further.

Animal Experiment

Figures 6A, 6B, 6C:
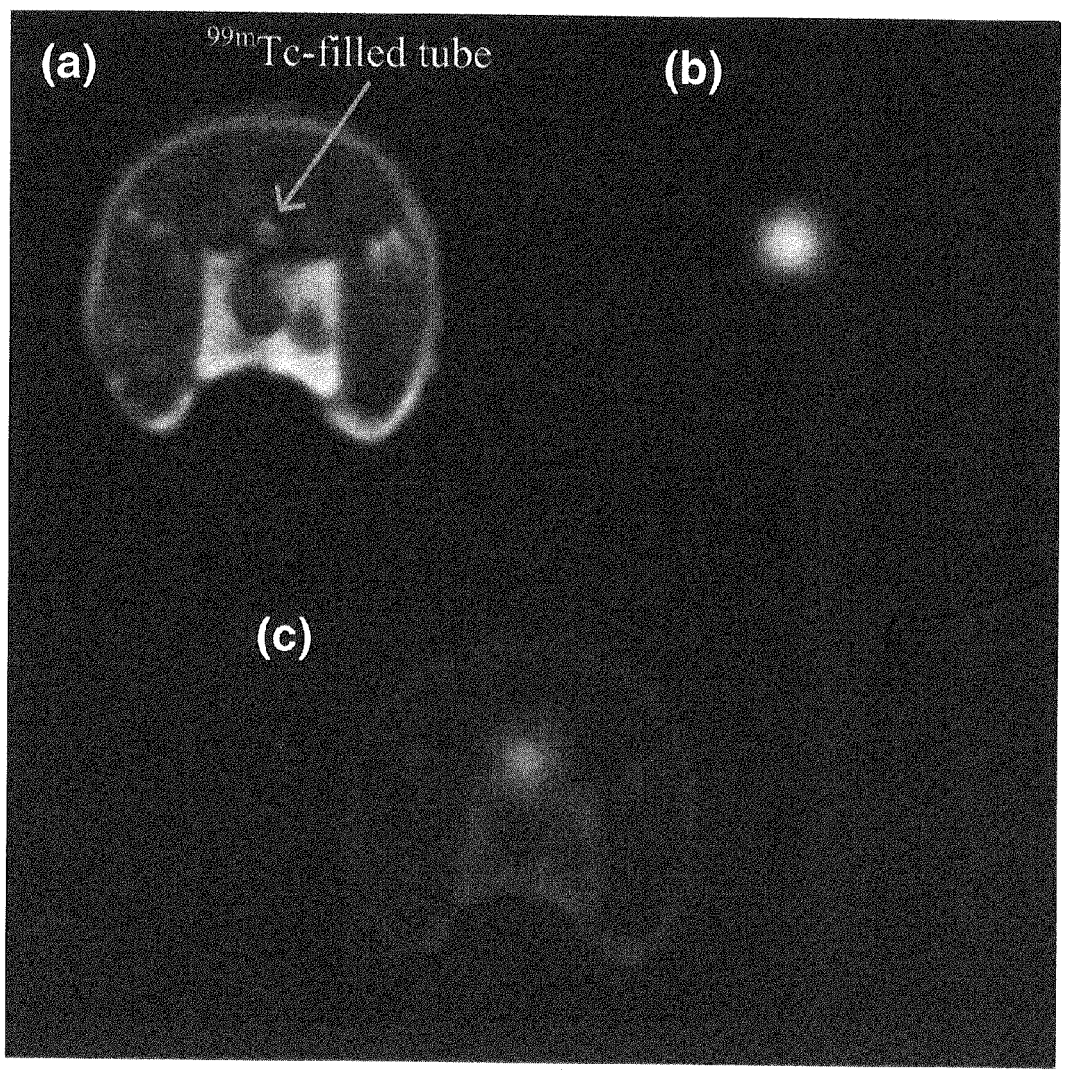
FIG. 6a is an axial MR image of a nude mouse containing a tube filled with 99mTc.
FIG. 6b is a co-registered reconstructed SPECT image.
FIG. 6c is a fusion of the SPECT and MR images for improved localization.

The axial MR magnitude image of the nude mouse is shown in FIG. 6a. The corresponding reconstructed SPECT image is shown in FIG. 6b. By itself, the exact location of the high activity region within the animal cannot be established due to a lack of anatomical detail. However, when the SPECT and MR images are fused together as shown in FIG. 6c, it becomes clearer that the high activity region corresponds to the 99mTc-filled tube. These results demonstrate the utility of co-registered SPECT/MR imaging for more accurate localization of the radiotracers. For this preliminary disclosure, the radioisotope was confined to a well defined region within the animal. For future studies, we plan to inject an appropriate radioisotope directly into a tumor-bearing animal to observe uptake of the tracer by the tumor.

In addition to the development of integrated SPECT and MRI reconstruction algorithms and more detailed animal experiments, our MRSPECT system may be expanded. In this disclosure, the nuclear radiation detector remained fixed while the object being imaged was manually rotated to obtain data from multiple views. Construction of a larger rotating gantry would allow for rotation of the detector about a (fixed) object. Furthermore, rotation of either the object or the detector could be automated through the use of MR-compatible motor 10 disclosed here.

For micro-SPECT applications using pinhole collimators, our birdcage RF coil may be appropriately modified by cutting out regions for the pinholes. Likewise, our MRSPECT system may be utilized for human imaging through the suitable scaling of components. For a scaled up parallel-hole collimator larger than the space between the rungs of a birdcage coil, the collimator may simply be placed outside the coil and attenuation of the gamma rays by the coil materials taken into consideration during data processing. Alternatively, an array of receiver coil loops may be utilized instead of a birdcage coil, where a much larger space between the coil elements is permissible for placement of a collimator. Use of an RF receiver array with integrated nuclear radiation detectors can be implemented for both small-animal and human-sized scales with improved MR image quality. Since both SPECT and MRI modalities are applicable to both small animals and humans, we anticipate that MRSPECT will play a significant role in molecular imaging for various human diseases in the near future.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following invention and its various embodiments.

Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations. A teaching that two elements are combined in a claimed combination is further to be understood as also allowing for a claimed combination in which the two elements are not combined with each other, but may be used alone or combined in other combinations. The excision of any disclosed element of the invention is explicitly contemplated as within the scope of the invention.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. An apparatus for use in an MRI field to rotate an object relative to the MRI field comprising an MRI compatible electric motor, the MRI compatible electric motor comprising:
   a disc made of iron-free, magnetic and paramagnetic-free MRI compatible material; and
   a plurality of electromagnetic coils disposed radially on the disc, so that when an electric current is passed through each coil, an induced magnetic field interacts with the main static magnetic field exerting a tangential torque to produce a torque on the disc depending on the main static magnetic field, the number of the coils, the applied electric current and the size of the disc,
   wherein the motor is disposed at least in a portion of the MRI field to employ the MRI field at least in part as a magnetic field within the motor for generation of motive force, and
   wherein the MRI field is a main static magnetic field produced by a main magnet.

2. The apparatus of claim 1 where the MRI compatible electric motor has no independently included magnetic field within the motor and where the MRI field is employed as the only magnetic field within the motor for generation of motive force.

3. The apparatus of claim 1 where the electrical motor exerts a variable torque with direct rotational motion and does not degrade MR images at distances larger than 30 cm from the center of the main magnet of the whole-body system.

4. The apparatus of claim 1 where the applied current to each coil is synchronized with a rotational spatial position of the corresponding coil of approximately 90° relative to the main static magnetic field.

5. A method of rotating an object relative to a MRI field comprising:
   disposing an MRI compatible rotatable disc having a plurality of coils disposed on a rotatable disc into a fringe magnetic field of a whole-body MRI system; and
   selectively applying an electric current through each coil of a plurality of coils disposed on a rotatable disc to generate a tangential torque on the disc depending on the main static magnetic field, the number of the coils, the applied electric current and the size of the disc.

6. The method of claim 5 where applying an electric current through each coil of a plurality of coils disposed on a rotatable disc to generate a tangential torque on the disc comprises producing a variable torque with direct rotational motion without degradation of MR images at distances larger than 30 cm from the center of the main magnet of the whole-body system.

7. The method of claim 5 where applying an electric current through each coil of a plurality of coils comprises synchronizing the application of the applied current to each coil with a rotational spatial position of the corresponding coil of approximately 90° relative to the main static magnetic field.

* * * * *